(12) United States Patent
Takaishi

(10) Patent No.: US 9,129,837 B2
(45) Date of Patent: Sep. 8, 2015

(54) SEMICONDUCTOR DEVICE

(71) Applicant: Micron Technology, Inc., Boise, ID (US)

(72) Inventor: Yoshihiro Takaishi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/467,474

(22) Filed: Aug. 25, 2014

(65) Prior Publication Data
US 2015/0084122 A1  Mar. 26, 2015

(30) Foreign Application Priority Data

Sep. 20, 2013  (JP) .................................. 2013-195654

(51) Int. Cl.
*H01L 21/8234* (2006.01)
*H01L 27/088* (2006.01)
*H01L 29/78* (2006.01)
*H01L 29/66* (2006.01)
*H01L 29/06* (2006.01)

(52) U.S. Cl.
CPC ...... *H01L 27/088* (2013.01); *H01L 21/823487* (2013.01); *H01L 29/66666* (2013.01); *H01L 29/7827* (2013.01); *H01L 29/0653* (2013.01)

(58) Field of Classification Search
CPC ................. H01L 21/82285; H01L 21/823487; H01L 27/10876; H01L 29/7371
See application file for complete search history.

(56) References Cited

U.S. PATENT DOCUMENTS

| 8,154,076 | B2 | 4/2012 | Takaishi | |
|---|---|---|---|---|
| 2011/0108910 | A1* | 5/2011 | Kosuge et al. | 257/329 |
| 2012/0032256 | A1* | 2/2012 | Takaishi et al. | 257/330 |
| 2013/0134507 | A1* | 5/2013 | Takaishi | 257/334 |
| 2014/0048860 | A1* | 2/2014 | Mikasa et al. | 257/296 |

FOREIGN PATENT DOCUMENTS

JP  2009088134  4/2009

* cited by examiner

*Primary Examiner* — Jae Lee
(74) *Attorney, Agent, or Firm* — Wells St. John, P.S.

(57) ABSTRACT

A semiconductor device has an active region defined by a device isolation region arranged on a surface of a semiconductor substrate, a plurality of transistor pillars arranged along a first direction within the active region, and a first dummy pillar disposed in the device isolation region. The first dummy pillar is arranged on a line extending along the first direction from the transistor pillars. The semiconductor device also has a second dummy pillar disposed between the transistor pillars and the first dummy pillar, a gate electrode continuously extending so as to surround each of side surfaces of the transistor pillars, a first power supply gate electrode surrounding a side surface of the first dummy pillar, and a second power supply gate electrode surrounding a side surface of the second dummy pillar. The second power supply gate electrode is connected to the gate electrode and the first power supply gate electrode.

14 Claims, 11 Drawing Sheets

SEMICONDUCTOR DEVICE

This application is based upon and claims the benefit of priority from Japanese patent application No. 2013-195654, filed on Sep. 20, 2013, the disclosure of which is incorporated herein in its entirety by reference.

BACKGROUND OF THE INVENTION

1. Field of the Invention

The present invention relates to a semiconductor device, and more particularly to a semiconductor device having vertical transistors.

2. Description of Related Art

In recent years, vertical transistors have been proposed to advance finer integration of transistors. A vertical transistor uses, as a channel, a semiconductor pillar extending perpendicular to a principal plane of a semiconductor substrate. Specifically, a vertical transistor includes a semiconductor pillar (a base column or a silicon pillar) formed so as to extend upward from a semiconductor substrate and a gate electrode formed on a side surface of the semiconductor pillar with a gate insulator film being interposed between the gate electrode and the semiconductor pillar. The vertical transistor also includes a drain region formed near a lower portion of the semiconductor pillar and a source region formed at an upper portion of the semiconductor pillar. A gate-lifting pillar (dummy pillar) is provided near the semiconductor (silicon) pillar in order to supply electric power to the gate electrode of the vertical transistor. Such a transistor is disclosed in JP-A-2009-88134, for example.

A vertical transistor requires a smaller space as compared to a planar transistor having a channel arranged in parallel to a principal plane of a semiconductor substrate. Furthermore, even if the channel length (gate length) is increased, an area required for a vertical transistor does not increase. In other words, a vertical transistor can suppress the short channel effect without any increase of a space required. Additionally, a vertical transistor can achieve full depletion of a channel and can advantageously provide a good S value (Subthreshold swing value) and a large drain current.

SUMMARY

In a vertical transistor, a cross-sectional area of a semiconductor pillar is reduced to achieve full depletion of a channel. Therefore, a vertical transistor cannot have large current driving capability. Thus, in order to have large current driving capability with characteristics of a vertical transistor, a plurality of semiconductor pillars may be provided and used as a parallel connection transistor in a semiconductor device using vertical transistors. In this case, a gate-lifting pillar (dummy pillar) is disposed adjacent to the semiconductor pillars so as to supply electric power to gate electrodes formed on side surfaces of the semiconductor pillars.

Such a gate-lifting pillar has a two-dimensional pattern determined by a wiring pattern, an arrangement of contacts, or the like. Therefore, an area (cross-sectional area) of the gate-lifting pillar unavoidably increases as compared to a two-dimensional pattern of semiconductor pillars. When a plurality of semiconductor pillars having the same size and a gate-lifting pillar having a two-dimensional pattern with a different area than that of the semiconductor pillars are arranged in a row, the optical proximity effect to each of the pillars during lithography varies depending upon the arrangement of the pillars. Specifically, when semiconductor pillars and a gate-lifting pillar are arranged along one direction, a semiconductor pillar disposed adjacent to a gate-lifting pillar has a different dimension than the dimension of other semiconductor pillars. As a result, transistors using a plurality of semiconductor pillars have varied characteristics. Thus, related semiconductor devices suffer from variations in characteristics of the entire parallel connection transistor. Accordingly, there has been demanded a method of manufacturing a plurality of semiconductor pillars with the same size.

In one embodiment, there is provided a device that includes an active region defined by a device isolation region arranged on a surface of a semiconductor substrate; a plurality of transistor pillars arranged along a first direction within the active region; a first dummy pillar disposed in the device isolation region, the first dummy pillar being arranged on a line extending along the first direction from the plurality of transistor pillars; a second dummy pillar disposed between the plurality of transistor pillars and the first dummy pillar; a gate electrode continuously extending so as to surround each of side surfaces of the plurality of transistor pillars; a first power supply gate electrode surrounding a side surface of the first dummy pillar; and a second power supply gate electrode surrounding a side surface of the second dummy pillar, the second power supply gate electrode being connected to the gate electrode and the first power supply gate electrode.

In another embodiment, there is provided a device that includes a plurality of transistor pillars arranged in a row at equal intervals within an active region defined by a device isolation region; a first dummy pillar disposed in the device isolation region so that the first dummy pillar is aligned with the row of the plurality of transistor pillars; and a second dummy pillar disposed centrally between one of the plurality of transistor pillars and the first dummy pillar. The first dummy pillar has a two-dimensional pattern greater than a two-dimensional pattern of each of the plurality of transistor pillars. The second dummy pillar has a two-dimensional pattern smaller than the two-dimensional pattern of each of the plurality of transistor pillars.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Experiment Results

Prior to the description of embodiments of the present invention, experiments made by the inventor for a related semiconductor device will be described with reference to FIGS. 1A, 1B, and 2.

Figure 1B:
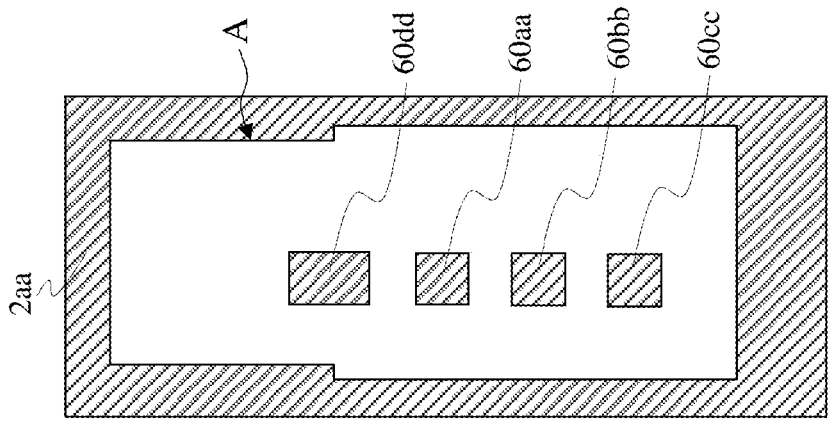
FIG. 1B is a plan view showing a layout of a pattern for an exposure mask used to provide the layout illustrated in FIG. 1A.
Figure 1A:
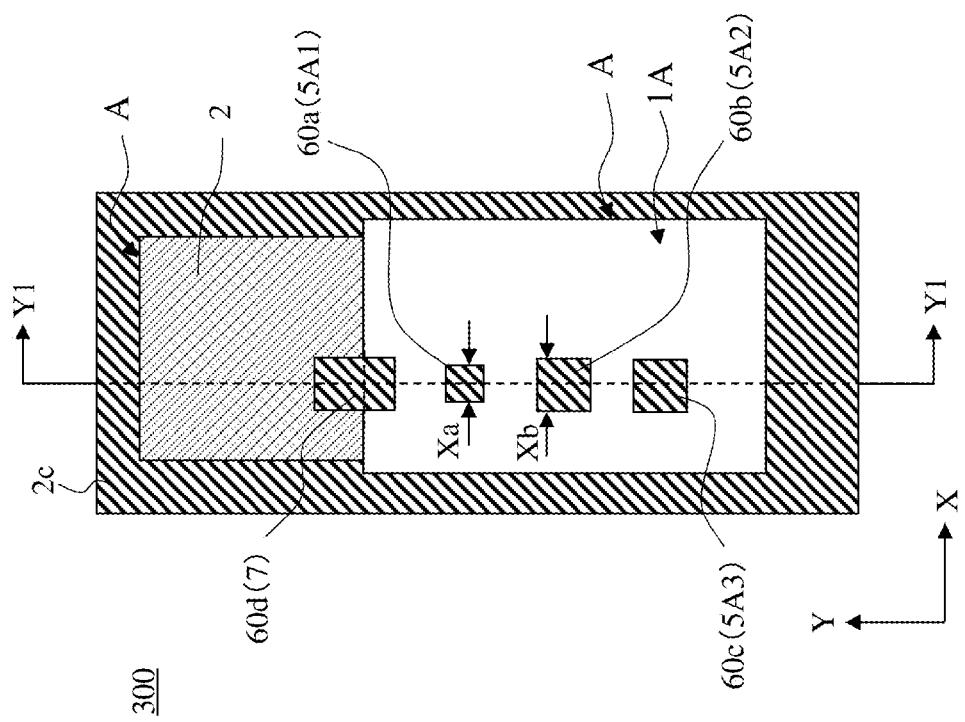
FIG. 1A is a plan view showing a layout of a related semiconductor device.

FIG. 1A is a plan view showing a layout of a semiconductor device 300 (parallel connection transistor) used in the experiments. The semiconductor device 300 includes a device isolation region 2 and an active region 1A surrounded by the device isolation region 2. The semiconductor device 300 also includes three transistor pillars (first to third transistor pillars) 5A1, 5A2, and 5A3 arranged along the Y-direction within the active region 1A and a dummy pillar 7 for supplying electric power to a gate electrode. The dummy pillar 7 is disposed adjacent to the first transistor pillar 5A1, which is located at an end of the array of the transistor pillars, in the Y-direction. Actually, FIG. 1A shows a state of the semiconductor device 300 during a manufacturing process. Thus, FIG. 1A shows a layout of first to third mask patterns 60a, 60b, and 60c located so as to correspond to the first to third transistor pillars 5A1, 5A2, and 5A3, which form a transistor, a mask pattern 60d located so as to correspond to the dummy pillar 7 for supplying electric power to a gate electrode, which is located adjacent to the first transistor pillar 5A1 in the Y-direction, and a peripheral mask pattern 2c.

FIG. 1B shows a pattern layout of an exposure mask used for lithography to form the aforementioned mask patterns 60a, 60b, 60c, and 60d. The exposure mask pattern includes three transistor pillar patterns (first to third transistor pillar patterns) 60aa, 60bb, and 60cc having the same size, a dummy pillar pattern 60dd having a size larger than the first transistor pillar pattern 60aa, and a peripheral shield pattern 2aa. The transistor pillar patterns 60aa, 60bb, and 60cc are arranged in the active region 1A. The dummy pillar pattern 60dd is arranged adjacent to the first transistor pillar pattern 60aa. The peripheral shield pattern 2aa surrounds a pillar groove formation region A.

When a pattern is transferred to a mask film 60 formed on a semiconductor substrate with the exposure mask having the exposure mask pattern shown in FIG. 1B, then mask patterns 60a to 60d are produced as shown in FIG. 1A. The result of this experiment revealed that the width Xa of the first mask pattern 60a (in each of the X-direction and the Y-direction), which corresponds to the first transistor pillar 5A1, became smaller than the widths Xb of the mask patterns 60b and 60c (Xb>Xa), which correspond to the other transistor pillars 5A2 and 5A3. This conceivably resulted from the optical proximity effect caused by different two-dimensional sizes of the dummy pillar pattern 60dd and the first transistor pillar pattern 60aa.

Figure 2:
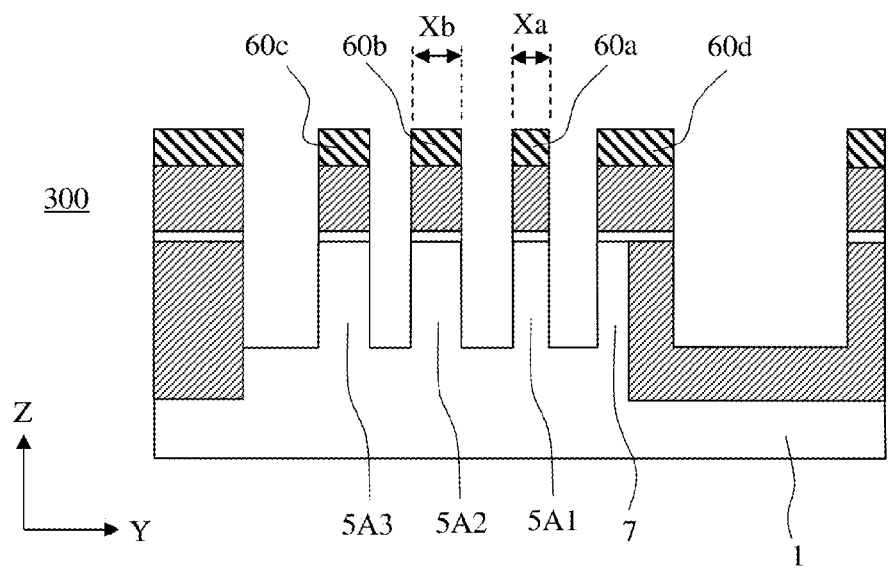
FIG. 2 is a cross-sectional view taken along line Y1-Y1 of FIG. 1A.

FIG. 2 is a cross-sectional view taken along line Y1-Y1 of FIG. 1A. Specifically, FIG. 2 is a cross-sectional view showing the semiconductor device 300 after the active region (semiconductor substrate) 1A and the device isolation region 2 located within the pillar groove formation region A, are etched by an anisotropic dry etching method using a mask of the mask patterns 60a, 60b, 60c, 60d, and 2c. As described above, the width Xa of the first mask pattern 60a is less than the widths Xb of the second and third mask patterns 60b and 60c. Therefore, the width of the first transistor pillar 5A1 covered with the first mask pattern 60a is less than the width of the second transistor pillar 5A2 covered with the second mask pattern 60b and the width of the third transistor pillar 5A3 covered with the third mask pattern 60c. In this manner, individual transistor pillars forming a parallel connection transistor have a varied width (cross-sectional area). As a result, the related semiconductor device 300 problematically exhibits varied characteristics as a parallel connection transistor.

First Embodiment

Semiconductor Device

Preferred embodiments of the present invention will be described in detail below with reference to the accompanying drawings.

Figure 3:
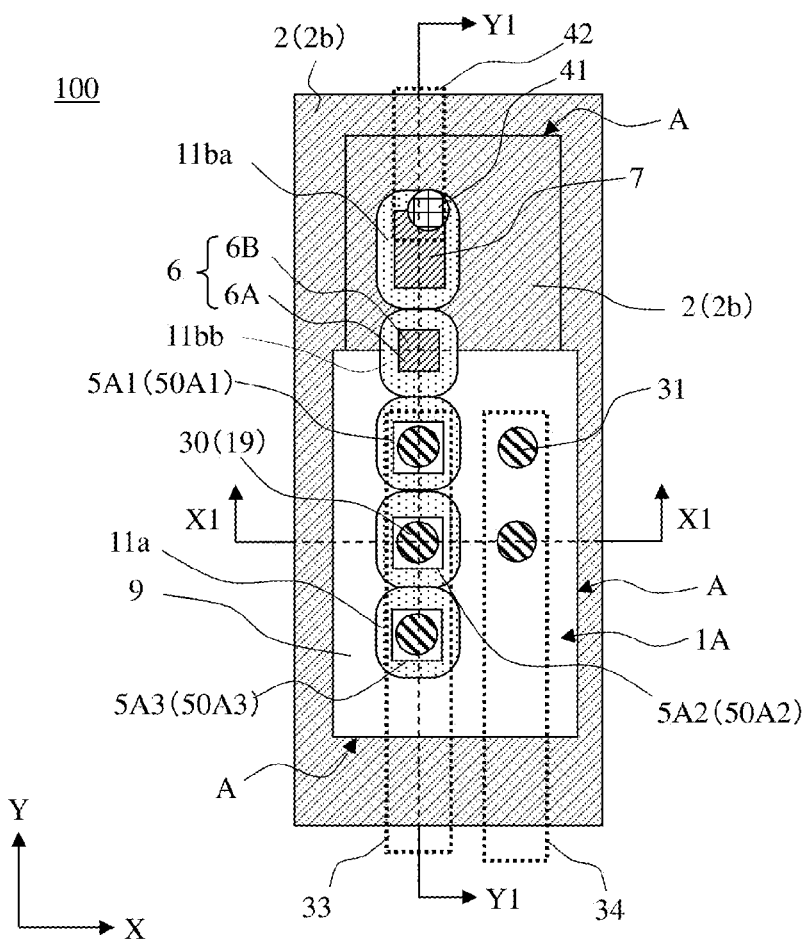
FIG. 3 is a schematic diagram (plan view) showing a configuration of a semiconductor device according to a first embodiment of the present invention.
Figure 4:
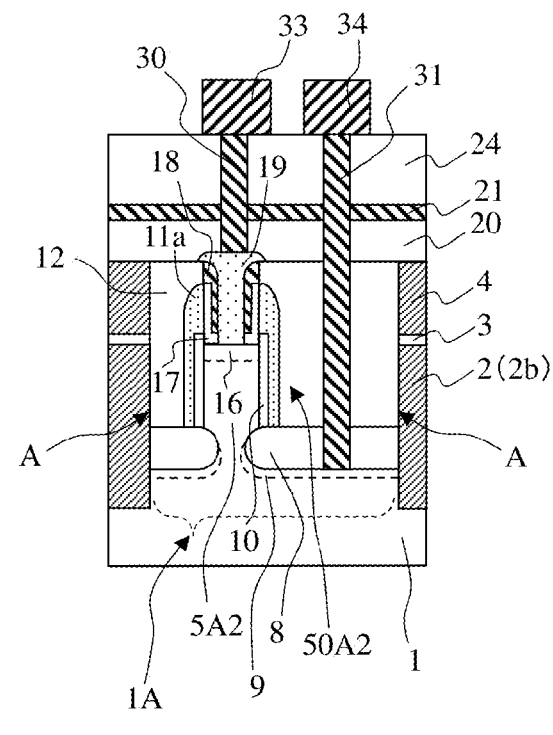
FIG. 4 is a cross-sectional view taken along line X1-X1 of FIG. 3.
Figure 5:
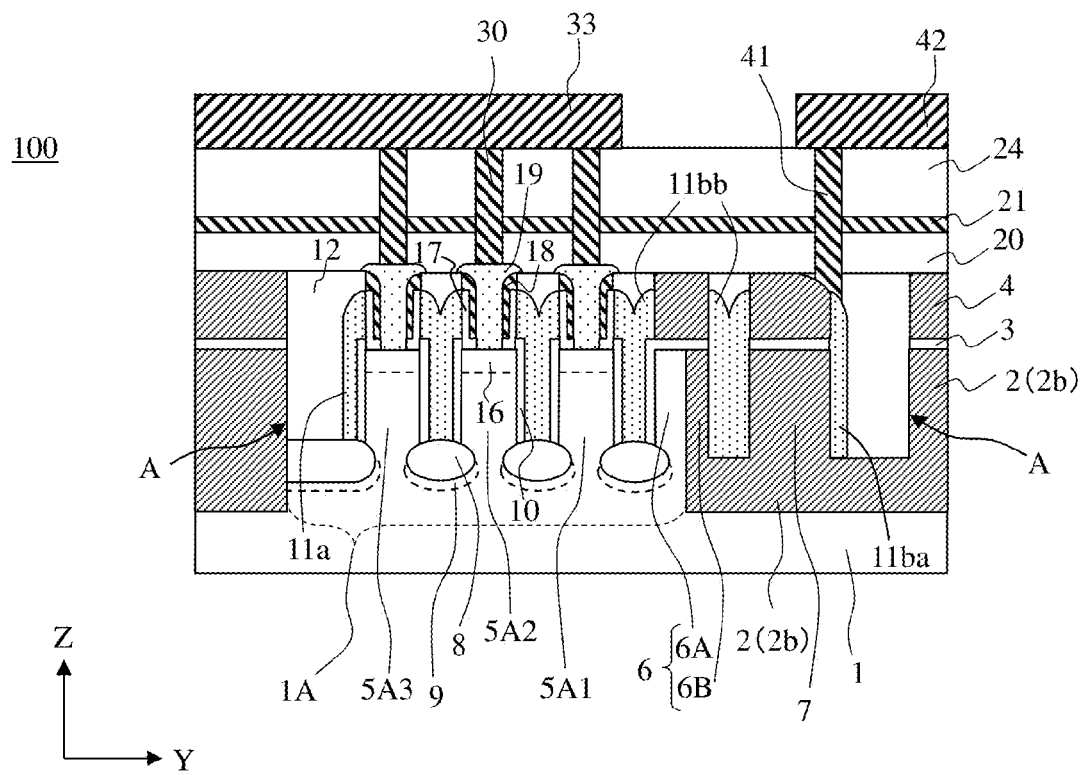
FIG. 5 is a cross-sectional view taken along line Y1-Y1 of FIG. 3.

First of all, an outlined configuration of a semiconductor device 100 according to a first embodiment of the present invention will be described with reference to FIGS. 3, 4, and 5. In FIGS. 3, 4, and 5, the scale and the number of components may be different than those of actual components for easy understanding. Furthermore, some components are illustrated as being transparent or by dashed lines. In each of FIGS. 3, 4, and 5, the XYZ coordinate system is set based upon the principal plane of a silicon substrate included in the semiconductor device 100. The Z-direction is perpendicular to the principal plane of the silicon substrate. The X-direction is parallel to the principal plane of the silicon substrate. The Y-direction is parallel to the principal plane of the silicon substrate and is perpendicular to the X-direction. Hereinafter, the Y-direction, the X-direction, and the Z-direction may be referred to as "a first direction," "a second direction," and "a third direction," respectively. The terms "upper" and "lower" are used with respect to the Z-direction.

FIG. 3 is a plan view showing a configuration of the semiconductor device 100 according to the first embodiment of the present invention. The semiconductor device 100 includes a semiconductor substrate 1 (see FIGS. 4 and 5) formed of monocrystalline silicon, a device isolation region 2 on an upper surface of the semiconductor substrate 1, and an active region 1A of the semiconductor substrate 1. The active region 1A is surrounded by the device isolation region 2. The device isolation region 2 is formed of an insulator film 2b such as a silicon oxide film.

The semiconductor device 100 includes a first transistor pillar 5A1, a second transistor pillar 5A2, and a third transistor pillar 5A3 arranged on a straight line along the Y-direction within the active region 1A. The first transistor pillar 5A1, the second transistor pillar 5A2, and the third transistor pillar 5A3 are formed on the semiconductor substrate 1 so as to project upward from the semiconductor substrate 1. Each of the transistor pillars 5 (5A1 to 5A3) forms a vertical transistor 50A (50A1 to 50A3). The first transistor pillar 5A1, the second transistor pillar 5A2, and the third transistor pillar 5A3 correspond to the first transistor 50A1, the second transistor 50A2, and the third transistor 50A3, respectively. Although FIG. 3 illustrates three transistors, the present invention is not limited to a semiconductor device having three transistors. Thus, four or more transistors may be arranged in the active region 1A.

The semiconductor device 100 has a first plug 30 formed above each of the vertical transistors 50A. The semiconductor device 100 also includes an interconnection 33 held in contact with upper surfaces of the first plugs 30. The first plugs 30 are connected to each other by the interconnection 33. Impurity diffusion layers are formed near a surface of the active region 1A around each of the transistor pillars 5. Those impurity diffusion layers constitute a lower diffusion layer 9 shared among the first to third transistors 50A1 to 50A3 (see FIG. 4). Furthermore, second plugs 31 are formed in the active region 1A. The second plugs 31 are connected to the lower diffusion layer 9 and shared among the vertical transistors 50A. Thus, the three vertical transistors 50A1 to 50A3 share with the lower diffusion layer 9 so that lower portions of the vertical transistors 50A1 to 50A3 are connected to each other. Upper portions of the three vertical transistors 50A1 to 50A3 are connected to each other by the interconnection 33. In this manner, the semiconductor device 100 includes one parallel connection transistor including three vertical transistors 50A connected in parallel to each other.

Meanwhile, a pillar groove formation region A is formed by the active region 1A and part of the device isolation region 2 that is adjacent to the active region 1A in the Y-direction. The semiconductor device 100 includes a first dummy pillar 7 formed in the device isolation region 2 within the pillar groove formation region A. The first dummy pillar 7 is aligned with the transistor pillars 5 along the Y-direction. Specifically, the first dummy pillar 7 is located adjacent to the first transistor pillar 5A1, which is located at the end of the array of the transistor pillars, with a certain interval between the first dummy pillar 7 and the first transistor pillar 5A1. The semiconductor device 100 also includes a second dummy pillar 6 formed between the first dummy pillar 7 and the transistor pillars 5. Specifically, the second dummy pillar 6 is located between the first transistor pillar 5A1, which is located at the end of the array of the transistor pillars, and the first dummy pillar 7. The transistor pillars 5, the second dummy pillar 6, and the first dummy pillar 7 are arranged on a straight line along the Y-direction.

As shown in FIG. 3, the second dummy pillar 6 is formed so as to extend over an interface between the active region 1A in the pillar groove formation region A and the device isolation region 2. The second dummy pillar 6 includes a second dummy silicon pillar 6A located in the active region 1A and a second dummy insulator film pillar 6B located in the device isolation region 2. In other words, the second dummy silicon pillar 6A and the second dummy insulator film pillar 6B are incorporated into a composite pillar such that side surfaces of the second dummy silicon pillar 6A and the second dummy insulator film pillar 6B are brought into contact with each other.

The first dummy pillar 7 serves as a power supply pillar for a gate electrode 11a of each of the transistors. The second dummy pillar 6 serves as a pattern correction pillar for performing a pattern correction so as to equalize the two-dimensional pattern of the first transistor pillar 5A1, which is located at the end of the array of the transistor pillars, with the two-dimensional patterns of the other transistor pillars 5A2 and 5A3. The second dummy pillar 6 also serves as a power supply pillar.

Further details of the semiconductor device 100 will be described with reference to FIG. 3. Each of the transistor pillars 5A, which forms a channel of the corresponding transistor 50A, has a rectangular shape having the same width in the Y-direction (first direction) and the same width in the X-direction (second direction) perpendicular to the Y-direction. In this example, the width of the transistor pillars 5A is 50 nm.

The three transistors 50A are spaced at certain intervals such that the centers of the transistors 50A are located on the same line along the Y-direction in a plan view. More specifically, the centers of the widths of the three transistor pillars (5A1, 5A2, and 5A3), the second dummy pillar 6, and the first dummy pillar 7 in the X-direction are spaced at certain intervals and located on the same line extending along the Y-direction. In this example, the intervals between the transistors 50A are 30 nm. The silicon plug 19, the first plug 30, and the interconnection 33 are disposed right above each of the transistors 50A.

Furthermore, the second dummy pillar 6, which has a rectangular shape in a plan view, is disposed adjacent to the first transistor pillar 5A1 with a certain interval in the Y-direction between the second dummy pillar 6 and the first transistor pillar 5A1. The widths of the second dummy pillar 6 in the X-direction and in the Y-direction are smaller than those of the transistor pillars 5. In this example, the widths of the second dummy pillar 6 in the X-direction and the Y-direction are 40 nm, and the interval between the first transistor pillar 5A1 and the second dummy pillar 6 is 35 nm.

The two-dimensional shape of each of the transistor pillars 5 and the second dummy pillar 6 is not limited to a rectangular shape and may be a circular. In any case, the area of the two-dimensional pattern of the second dummy pillar 2 is smaller than the area of the two-dimensional pattern of each of the transistor pillars 5.

Moreover, the first dummy pillar 7, which has a rectangular shape in a plan view, is disposed adjacent to the second dummy pillar 6 in the Y-direction within the device isolation region 2. The area of the two-dimensional pattern of the first dummy pillar 7 is greater than the area of the two-dimensional pattern of each of the transistor pillars 5. For example, the width of the first dummy pillar 7 in the X-direction is equal to the width of the transistor pillars 5 in the X-direction. The width of the first dummy pillar 7 in the Y-direction is greater than the width of the transistor pillars 5 in Y-direction but equal to or smaller than 1.5 times the width of the transistor pillars 5 in Y-direction. In this example, the width of the first dummy pillar 7 in the X-direction is 50 nm, and the width of the first dummy pillar 7 in the Y-direction is 75 nm. The interval between the first dummy pillar 7 and the second dummy pillar 6 is 35 nm.

The semiconductor device 100 includes a contact plug 41 disposed on the first dummy pillar 7 and an interconnection 42 formed on an upper surface of the contact plug 41.

The contact plug 41 is disposed at such a position that it partially overlaps the first dummy pillar 7 in the plan view. The contact plug 41 slightly extends outward from the first dummy pillar 7 in the Y-direction. In FIG. 3, the contact plug 41 is offset in the X-direction and the Y-direction with respect to the first dummy pillar 7. However, the arrangement of the contact plug 41 is not limited to this example. For example, the contact plug 41 may be offset either in the X-direction or in the Y-direction as long as it is out of contact with the active region 1A and all of the transistor pillars 5.

The semiconductor device 100 includes a gate electrode 11a, which covers all side surfaces of the transistor pillars 5 with a gate insulator film 10 (see FIGS. 4 and 5) being interposed between the gate electrode 11a and the transistor pillars 5. Portions of the gate electrode 11a that surround each of the transistor pillars 5 fill gaps (spaces) between adjacent transistor pillars 5 and connect together so as to serve as one gate electrode 11a shared among the transistor pillars 5.

The semiconductor device 100 also includes a first power supply gate electrode 11ba covering the entire side surface of the first dummy pillar 7 and a second power supply gate electrode 11bb covering the entire side surface of the second dummy pillar 6. The first power supply gate electrode 11ba and the second power supply gate electrode 11bb fill a gap between the second dummy pillar 6 and the first dummy pillar 7 and connect together. Furthermore, the second power supply gate electrode 11bb fills a gap between the second dummy pillar 6 and the transistor pillar that is closest to the second dummy pillar 6 (the transistor pillar 5A1 in FIG. 3) so as to connect with the gate electrode 11a. Therefore, the first power supply gate electrode 11ba is connected to the gate electrode 11a via the second power supply gate electrode 11bb formed over the side surface of the second dummy pillar 6, which also serves as a pattern correction pillar.

The portion of the contact plug 41 that extends outward from the first dummy pillar 7 in the plan view is connected to the first power supply gate electrode 11ba. The thickness of the gate electrode 11a, the first power supply gate electrode 11ba, and the second power supply gate electrode 11bb in the plan view (the thickness in the X-direction) is 20 nm. Hereinafter, the gate electrode 11a, the first power supply gate electrode 11ba, and the second power supply gate electrode 11bb are collectively referred to as the gate electrode 11. Assuming that the thickness of the gate electrode 11 is 20 nm, the intervals between the transistor pillars 5 (i.e., 30 nm), the interval between the first transistor pillar 5A1 and the second dummy pillar 6 (i.e., 35 nm), and the interval between the second dummy pillar 6 and the first dummy pillar 7 (i.e., 35 nm) are less than two times the thickness of the gate electrode 11. Therefore, the gaps between the pillars are filled with the gate electrode 11. Thus, portions of the gate electrode 11 that cover the side surfaces of the pillars serve as one gate electrode 11. Accordingly, a gate voltage applied to the first power supply gate electrode 11ba of the first dummy pillar 7 is supplied to the gate electrode 11a of the first transistor pillar 5A1 via the second power supply gate electrode 11bb of the second dummy pillar 6.

The semiconductor device 100 includes an interconnection 34 formed right above the second plugs 31. The interconnection 34 is connected to the pillar lower diffusion layer 9 (see FIG. 4), which is part of a transistor, via the second plugs 31. Thus, the interconnection 34 supplies electric power to the pillar lower diffusion layer 9.

Reference is now made to cross-sectional views of FIGS. 4 and 5. FIG. 4 is a cross-sectional view taken along line X1-X1 of FIG. 3, and FIG. 5 is a cross-sectional view taken along line Y1-Y1 of FIG. 3.

As illustrated in FIGS. 4 and 5, the device isolation region 2, which comprises an insulator film 2b, is formed on a portion of the upper surface of the silicon substrate 1. The three transistor pillars 5 including the first transistor pillar 5A1 to the third transistor pillar 5A3 extend upward as semiconductor base columns (semiconductor pillars) in the active region 1A, which is formed by a portion of the silicon substrate 1 that is surrounded by the device isolation region 2.

Each of the transistor pillars 5 is a columnar semiconductor, which is part of a channel portion of the corresponding transistor 50A. Therefore, each of the transistors 50A is a vertical transistor. The three transistor pillars 5 are arranged with the same height in the active region 1A defined by the device isolation region 2. Furthermore, each of the transistor pillars has such a thickness (size) so as to achieve full depletion. In this case, the thickness of the transistor pillar refers to a cross-sectional area taken on a plane parallel to the surface of the silicon substrate 1.

Each of the transistors 50A has impurity diffusion layers 16 and 9 formed on (near) an upper end and a lower end of the transistor pillar 5, respectively. The pillar upper diffusion layer 16 located on the upper end of the transistor pillar 5 serves as one of a source and a drain, whereas the pillar lower diffusion layer 9 located on the lower end of the transistor pillar 5 serves as the other of the source and the drain. A central portion of the transistor pillar that is sandwiched between the pillar upper diffusion layer 16 and the pillar lower diffusion layer 9 serves as a channel portion.

As shown in FIG. 5, in the Y-direction, the second dummy pillar 6 is disposed adjacent to the first transistor pillar 5A1, which is the endmost pillar of the three transistor pillars 5A1 to 5A3 in the Y-direction. The transistor pillars 5 and the second dummy silicon pillar 6A are formed by etching the surface of the silicon substrate 1. The second dummy insulator film pillar 6B is formed by etching the surface of the device isolation region 2.

The second dummy silicon pillar 6A is a columnar semiconductor that projects from the surface of the silicon substrate 1. The second dummy insulator film pillar 6B is a columnar insulator that projects in the device isolation region 2.

The first dummy pillar 7 is arranged adjacent to the second dummy pillar 6 in the Y-direction. The first dummy pillar 7 is located in the device isolation region 2 and is a columnar insulator formed of an insulator film 2b. The first dummy pillar 7 serves as a projecting layer for increasing a height of the first power supply gate electrode 11ba to reduce a distance between the first power supply gate electrode 11ba and the overlaid interconnection 42.

The gate electrode 11a surrounding the side surfaces of the transistor pillars 5, the second power supply gate electrode 11bb surrounding the side surface of the second dummy pillar 6, and the first power supply gate electrode 11ba surrounding the side surface of the first dummy pillar 7 fill gaps between those pillars and connect together to form one contiguous gate electrode 11.

The insulator film 8 is formed around the transistor pillars 5 and the second dummy silicon pillar 6A on the upper surface of the active region 1A (silicon substrate 1). The insulator film 8 covers the peripheries of lower portions of the transistor pillars 5 and the second dummy silicon pillar 6A and reaches the device isolation region 2.

The pillar lower diffusion layer 9 is arranged beneath the insulator film 8 so that the insulator film 8 overlaps the pillar lower diffusion layer 9. The pillar lower diffusion layer 9 and the gate electrode 11 are electrically isolated from each other by the insulator film 8. The pillar lower diffusion layer 9 electrically connects the three transistor pillars 5 to each other and serves as a lower diffusion layer common to the three transistors 50A of the first transistor 50A1 to the third transistor 50A3.

The device isolation region 2 is formed to be deeper than the pillar lower diffusion layer 9. Thus, the pillar lower diffusion layer 9 is prevented from being electrically connected between adjacent active regions interposing the device isolation region 2 therebetween.

A gate insulator film 10 is formed on each of the side surfaces of the transistor pillars 5 and the second dummy silicon pillar 6A. Furthermore, the gate electrode 11a and the second power supply gate electrode 11bb are formed with a thickness of 20 nm (thickness in the X-direction) on the gate insulator film 10, which is formed on each of the side surfaces of the transistor pillars 5 and the second dummy silicon pillar 6A. No gate insulator film 10, but the power supply gate electrodes 11b are formed on the side surfaces of the second dummy insulator film pillar 6B and the first dummy pillar 7.

The gate insulator film 10 covers the outer circumferential surfaces of the transistor pillars 5. The gate insulator film 10 is connected to the insulator film 8. The channel portions of the transistor pillars 5, the pillar upper diffusion layers 16, and the pillar lower diffusion layer 9 located below the insulator film 8 are electrically isolated from the gate electrode 11 by the gate insulator film 10 and the insulator films 8.

As shown in FIG. 4, for example, the second transistor 50A2 includes the pillar lower diffusion layer 9, the pillar upper diffusion layer 16, the gate insulator film 10, and the gate electrode 11a.

Referring back to FIG. 5 in addition to FIG. 4, an insulator film 3 is formed on upper surfaces of the device isolation region 2, the second dummy pillar 6, and the first dummy pillar 7. Furthermore, a mask film 4 is formed above the upper surfaces of the device isolation region 2, the second dummy pillar 6, and the first dummy pillar 7 so that the insulator film 3 is covered with the mask film 4. A first interlayer insulator film 12 is formed so that the gate electrode 11 and the insulator film 8 are covered with the first interlayer insulator film 12. The first interlayer insulator film 12 is embedded in the pillar groove formation region A. Specifically, the first interlayer insulator film 12 is formed in a region surrounded by sidewalls of the device isolation region 2, the insulator film 3, and the mask film 4.

A second interlayer insulator film 20 is formed on upper surfaces of the mask film 4 and the first interlayer insulator film 12. A stopper film 21 is formed so that the second interlayer insulator film 20 is covered with the stopper film 21. Furthermore, a third interlayer insulator film 24 is formed so that the stopper film 21 is covered with the third interlayer insulator film 24. Interconnections 33, 34, and 42 are formed on an upper surface of the third interlayer insulator film 24.

The interconnection 42 is connected to the first power supply gate electrode 11ba via the contact plug 41, which extends through the third interlayer insulator film 24, the stopper film 21, the second interlayer insulator film 20, and the first interlayer insulator film 12.

The interconnection 33 is connected to the pillar upper diffusion layer 16 of the respective transistor pillars via the first plugs 30, each of which extends through the third interlayer insulator film 24, the stopper film 21, and the second interlayer insulator film 20, and via the silicon plugs 19, each of which is surrounded by the first interlayer insulator film 12 and the gate electrode 11.

The silicon plug 19 is produced by doping (diffusing) an impurity such as arsenic into silicon. The silicon plug 19 serves as one of the source and the drain of the transistor 50A, along with the pillar upper diffusion layer 16. A sidewall film 18 and an insulator film 17 are formed on a side surface of each of the silicon plugs 19. The silicon plugs 19 and the gate electrode 11a are electrically isolated from each other by the sidewall film 18 and the insulator film 17.

The interconnection 34 is connected to the pillar lower diffusion layer 9 via the second plugs 31, each of which extends through the third interlayer insulator film 24, the stopper film 21, the second interlayer insulator film 20, the first interlayer insulator film 12, and the insulator film 8.

In the experimental example described with reference to FIGS. 1 and 2, the dummy pillar 7 for gate power supply is disposed adjacent to the transistor pillars 5 arranged along the first direction. As a result of different sizes of the two-dimensional pattern of the transistor pillars 5 and the two-dimensional pattern of the dummy pillar 7, the optical proximity effect during pattern formation using lithography produces a difference between the shape of the two-dimensional pattern of the first transistor pillar 5A1 located at the endmost position and the shapes of the two-dimensional patterns of the second and third transistor pillars. Such variations in shape of the transistor pillars problematically cause variations in characteristics of the parallel connection transistor.

In contrast, according to the semiconductor device 100 of the first embodiment, the second dummy pillar 6, which serves as a pattern correction pillar, is arranged between the transistor pillars 5 and the first dummy pillar 7, which serves as a gate power supply pillar. With this configuration, the optical proximity effect resulting from a large two-dimensional pattern of the first dummy pillar 7 extends to the second dummy pillar 6, which does not serve as a transistor, but does not extend to the first transistor pillar 5A1. Therefore, a parallel connection transistor having stabilized characteristics can be obtained with the same two-dimensional shape of the first to third transistor pillars.

(Method of Manufacturing a Semiconductor Device)

Next, a method of manufacturing a semiconductor device 100 according to the first embodiment will be described in detail below with reference to FIGS. 6 to 19. Although the silicon substrate 1 described below is a p-type monocrystalline substrate, the silicon substrate 1 is not limited to such a substrate.

Figure 6:
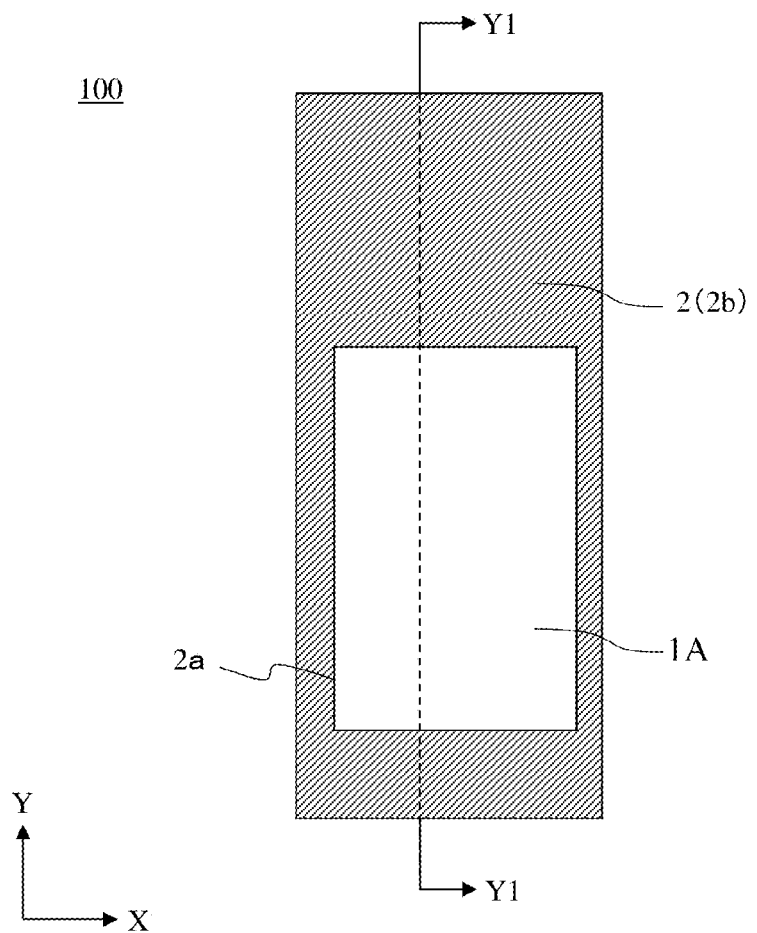
FIG. 6 is a diagram (plan view) explanatory of a method of manufacturing a semiconductor device according to the first embodiment of the present invention.
Figure 7:
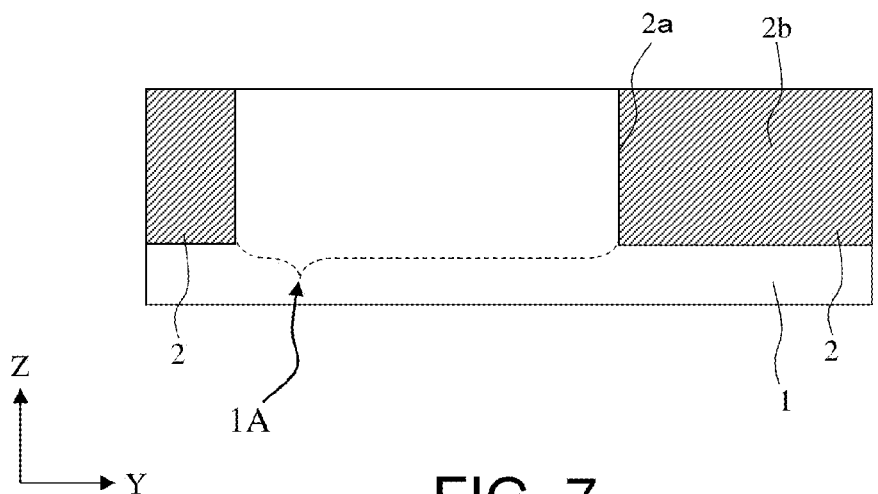
FIG. 7 is a cross-sectional view taken along line Y1-Y1 of FIG. 6.

First, reference is made to FIGS. 6 and 7. FIG. 6 is a plan view explanatory of a manufacturing process of the semiconductor device 100, and FIG. 7 is a cross-sectional view taken along line Y1-Y1 of FIG. 6.

As shown in FIGS. 6 and 7, a groove 2a is formed in the silicon substrate 1 by using a photolithography method and a dry etching method. The groove 2a is formed so as to define an active region 1A, i.e., to surround a periphery of the active region 1A. For example, the depth of the groove 2a is 250 nm. Then an insulator film 2b of a silicon nitride film or a silicon oxide film is deposited on the entire surface of the silicon substrate 1 by a chemical vapor deposition (CVD) method, so that the interior of the groove 2a is filled with the insulator film 2b. Thereafter, an unnecessary portion of the insulator film 2b formed on the silicon substrate 1 is removed by a chemical mechanical polishing (CMP) method so that the insulator film 2b remains only within the groove 2a. Thus, a device isolation region 2 is formed. Therefore, on an upper surface of the silicon substrate 1, the active region 1A is surrounded by the device isolation region 2. In FIG. 6, the active region 1A is illustrated as having a rectangular shape. However, the shape of the active region 1A is not limited to a rectangular shape. Furthermore, the dimension of the active region 1A in the X-direction and Y-direction can be changed in any manner depending upon the number of the transistor pillars arranged within the active region 1A. Two or more active regions 1A may also be provided.

Figure 8:
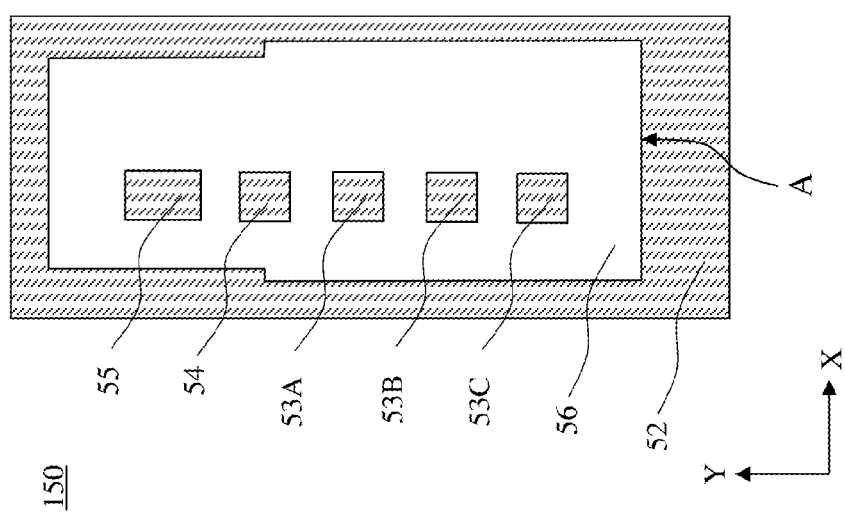
FIG. 8 is a diagram (plan view) showing an exposure mask to explain a method of manufacturing a semiconductor device according to the first embodiment of the present invention.

Reference is now made to FIG. 8. FIG. 8 is a plan view showing a configuration of an exposure mask 150 used in a photolithography process to be described in connection with FIG. 9. It is assumed that a positive photoresist is used as the exposure mask 150.

The exposure mask 150 includes an outer light shield portion 52 corresponding to an area other than the pillar groove formation region A, first light shield portions 53 (53A, 53B, and 53C) corresponding to the areas of the three transistor pillars (5A1 to 5A3), a second light shield portion 54 corresponding to the area of the second dummy pillar 6, and a third light shield portions 55 corresponding to the area of the first dummy pillar 7. An area other than the first to third light shield portions 53, 54, and 55 in the pillar groove formation region A is defined as a light transmission portion 56.

The first light shield portions 53 are now described in greater detail. The first light shield portions 53 are formed by a first light shield portion 53A corresponding to the area of the first transistor pillar 5A1, a first light shield portion 53B corresponding to the area of the second transistor pillar 5A2, and a first light shield portion 53C corresponding to the area of the third transistor pillar 5A3.

Each of the first light shield portions 53 has a rectangular shape having widths of 50 nm in the X-direction and the Y-direction, respectively. The second light shield portion 54 has the same two-dimensional size as each of the first light shield portions 53. The third light shield portion 55 has a rectangular shape having a width of 50 nm in the X-direction and a width of 75 nm in the Y-direction. The two-dimensional shape of the first light shield portions 53 and the second light shield portion 54 is not limited to a rectangular shape and may be a circular shape.

The exposure mask 150 used for manufacturing a semiconductor device in this embodiment has a pattern arrangement including the second light shield portion 54 corresponding to the two-dimensional pattern of the second dummy pillar 6, which serves as a pattern correction pillar. The second light shield portion 54 is arranged between the first shield portion 53A corresponding to the two-dimensional patterns of the first transistor pillar 5A1 and the third light shield portion 55 corresponding to the two-dimensional pattern of the first dummy pillar 7.

Figure 9:
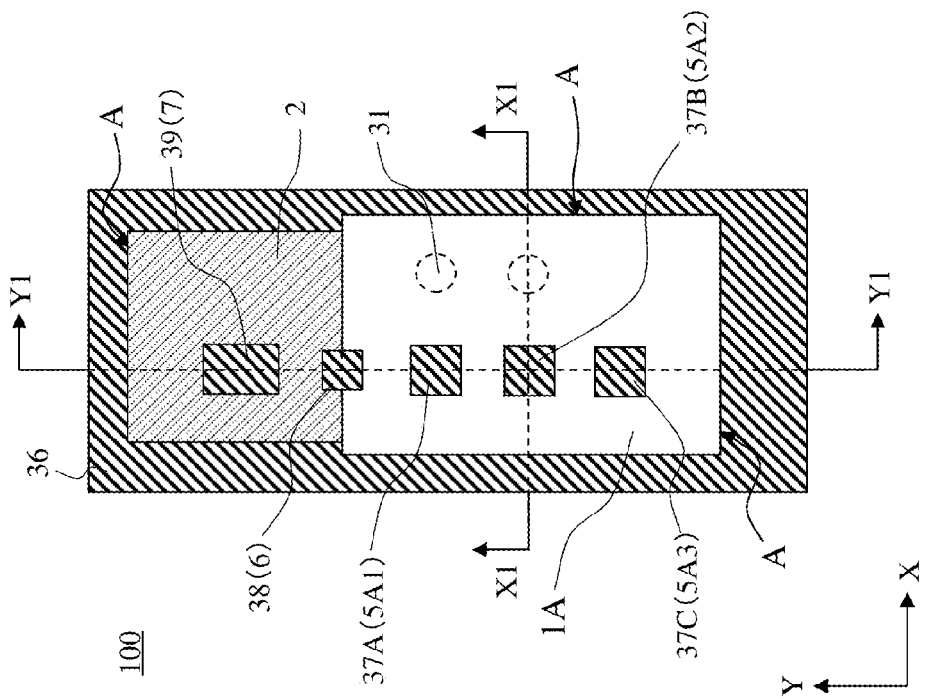
FIG. 9 is a diagram (plan view) explanatory of a method of manufacturing a semiconductor device according to the first embodiment of the present invention.
Figure 10:
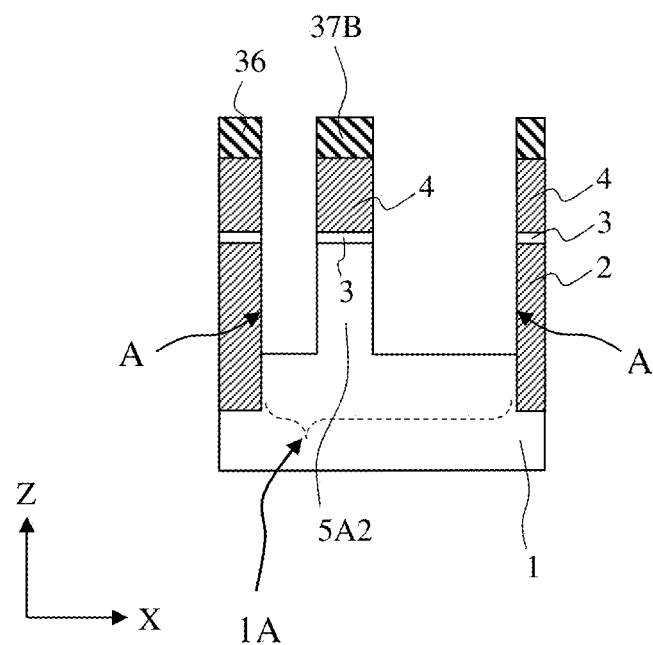
FIG. 10 is a cross-sectional view taken along line X1-X1 of FIG. 9.
Figure 11:
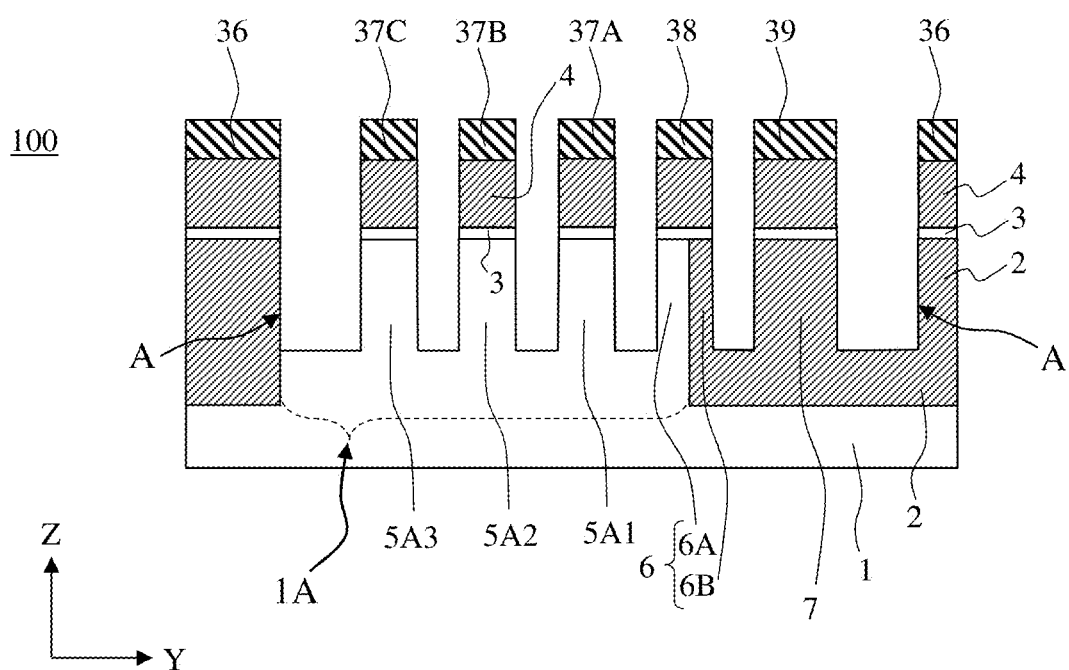
FIG. 11 is a cross-sectional view taken along line Y1-Y1 of FIG. 9.

Reference is now made to FIGS. 9 to 11. FIG. 9 is a plan view explanatory of a process following the process illustrated in FIGS. 6 and 7. FIG. 10 is a cross-sectional view taken along line X1-X1 of FIG. 9, and FIG. 11 is a cross-sectional view taken along line Y1-Y1 of FIG. 9.

As shown in FIGS. 9 to 11, an insulator film 3 of a silicon oxide film is formed on the silicon substrate 1 with a thickness of 2 nm by a CVD method. Then a mask film 4 of a silicon nitride film is formed with a thickness of 120 nm. Thereafter, photoresist masks 36 to 39 are formed with an arrangement corresponding to the light shield portions 52 to 55 by a photolithography method using the exposure mask 150. Specifically, a photoresist mask 36 is formed so as to correspond to the arrangement of the light shield portion 52. Simultaneously, first photoresist masks 37A, 37B, and 37C are formed so as to correspond to the arrangement of the three first light shield portions 53. Furthermore, a second photoresist mask 38 is formed so as to correspond to the arrangement of the second light shield portion 54. A third photoresist mask 39 is also formed so as to correspond to the arrangement of the third light shield portion 55. A hard mask such as an amorphous carbon film may be formed below the photoresist masks (36 to 39).

As described above, in the exposure mask 150, the second light shield portion 54 has the same dimension (50 nm) as the first light shield portion 53. Meanwhile, the two-dimensional size of the third light shield portion 55 is greater than the two-dimensional size of the second light shield portion 54. As a result, when the photoresists on the semiconductor substrate 1 are exposed with the exposure mask 150 shown in FIG. 8 for lithography, then the two-dimensional light intensity distribution for transmission around the second light shield portion 54 is varied by the optical proximity effect. Thus, the size of the second photoresist mask 38 formed on the semiconductor substrate 1 is reduced to 40 nm. On the other hand, the two-dimensional light intensity distribution for transmission around the three first light shield portions 53A, 53B, and 53C, which are further spaced from the third light shield portion 55 by the second light shield portion 54 becomes uniform without influence from the third light shield portion 55. Therefore, the first photoresist masks 37A, 37B, and 37C are formed on the semiconductor substrate 1 with a pattern that is accurate to the size of the exposure mask 150. Thus, the second light shield portion 54 serves as an exposure mask for pattern correction to prevent pattern variations of the first photoresist masks 37A, 37B, and 37C, which are masks for formation of the transistor pillars, and to equalize patterns of those first photoresist masks 37A, 37B, and 37C.

In this manner, use of the exposure mask 150 with the second light shield portion 54 thus arranged makes the exposure intensity around the first light shield portion 53A constant. As a result, variations in size of the finished photoresist mask 37A formed by the first light shield portion 53A can be reduced in the semiconductor device 100.

Intervals between the first photoresist masks 37, the second photoresist mask 38, and the third photoresist mask 39 are not more than two times the film thickness of a gate electrode to be formed in a subsequent process. Specifically, in FIG. 9, the intervals between the first photoresist mask 37A to the first photoresist mask 37C, which are formed so that the centers of those first photoresist masks are aligned with the same line along the Y-direction, are 30 nm. Furthermore, one second photoresist mask 38 is arranged adjacent to the first photoresist mask 37A in the Y-direction with an interval that is not more than two times the film thickness of the gate electrode. In this example, the interval between the first photoresist mask 37A and the second photoresist mask 38 is 35 nm. A third photoresist mask 39 is arranged adjacent to the first second photoresist mask 38 in the Y-direction with an interval that is not more than two times the film thickness of the gate electrode. In this example, the interval between the second photoresist mask 38 and the third photoresist mask 39 is 35 nm. For example, the width of the third photoresist mask 39 in the X-direction is 50 nm, and the width of the third photoresist mask 39 in the Y-direction is 75 nm.

Next, the pattern of the photoresist masks is transferred to the mask film 4 and the insulator film 3 by an anisotropic dry etching method using the photoresist masks (36 to 39). Thus, the upper surface of the silicon substrate 1 and the upper surface of the device isolation region 2 are exposed within the patterned opening portion (pillar groove formation region A). Then the photoresists (and the hard masks if they have been formed) are removed.

Thereafter, the exposed portions of the silicon substrate 1 and the device isolation region 2 are bored to a depth of 150 nm with a mask of the mask film 4 by an anisotropic dry etching method. Thus, three transistor pillars 5 (5A1 to 5A3), which serve as channels of the transistors, a second dummy pillar 6, and a first dummy pillar 7, which is to connect the power supply gate electrode to the overlaid interconnection, are formed.

Each of the pillars is formed so as to project upward from the bored upper surface of the silicon substrate 1 and the bored upper surface of the device isolation region 2. Thus, each of the transistor pillars (5A1 to 5A3) is formed with a rectangular shape having widths of 50 nm in the X-direction and in the Y-direction. Furthermore, as shown in FIG. 11, the second dummy pillar 6 is formed as a composite pillar into which the second dummy silicon pillar 6A provided in the active region 1A and the second dummy insulator film pillar 6B provided in the device isolation region 2 are incorporated so that side surfaces of those second dummy pillars 6A and 6B are brought into contact with each other.

Next, side surfaces of the transistor pillars 5 and the second dummy silicon pillar 6A are oxidized with a thickness of 5 nm by a thermal oxidation method (not shown). Subsequently, a silicon nitride film is deposited with a thickness of 20 nm by a CVD method. Thereafter, entire-surface etching-back is carried out so as to form sidewall films (not shown) on the transistor pillars 5, the second dummy pillar 6, and the mask film 4.

Figure 12:
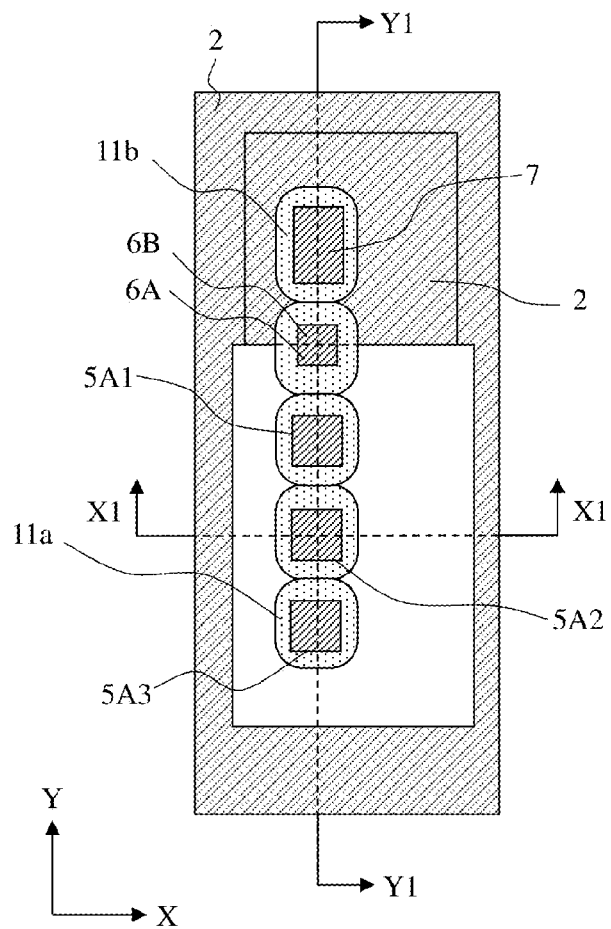
FIG. 12 is a diagram (plan view) explanatory of a method of manufacturing a semiconductor device according to the first embodiment of the present invention.
Figure 13:
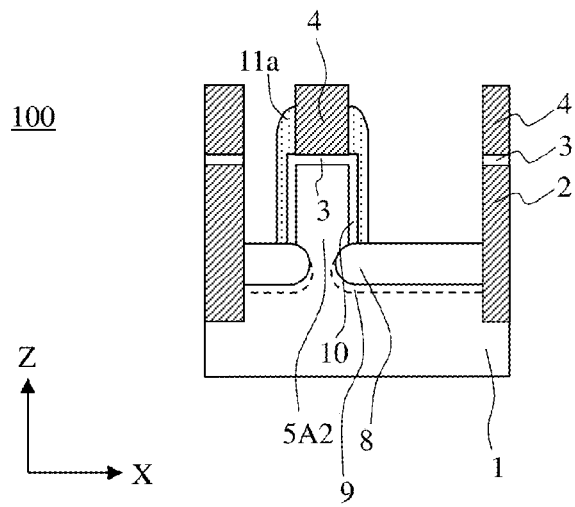
FIG. 13 is a cross-sectional view taken along line X1-X1 of FIG. 12.
Figure 14:
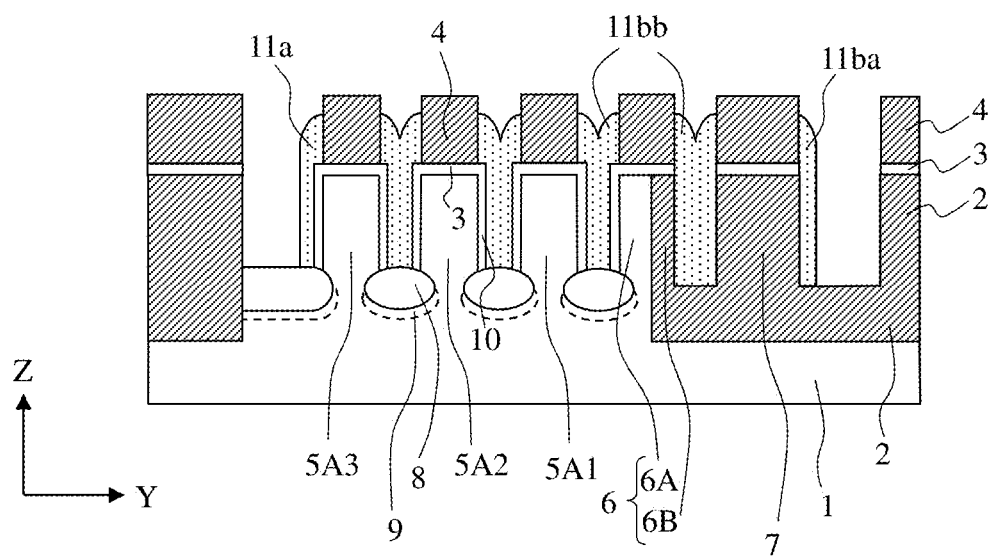
FIG. 14 is a cross-sectional view taken along line Y1-Y1 of FIG. 12.

Reference is now made to FIGS. 12 to 14. FIG. 12 is a plan view explanatory of a process following the process illustrated in FIGS. 9 to 11. FIG. 13 is a cross-sectional view taken along line X1-X1 of FIG. 12, and FIG. 14 is a cross-sectional view taken along line Y1-Y1 of FIG. 12.

As shown in FIGS. 12 to 14, an insulator film 8 is formed with a thickness of 30 nm on an exposed portion of the upper surface of the active region 1A around the respective transistor pillars by a thermal oxidation method. At that time, side surfaces of the transistor pillars 5 and the second dummy pillar 6 are not oxidized because they are covered with a silicon nitride film (sidewall film). Next, a pillar lower diffusion layer 9 is formed below the insulator film 8 by an ion implantation method. The pillar lower diffusion layer 9 is shared among the three transistor pillars 5 (5A1 to 5A3). Arsenic may be used as an n-type impurity for ion implantation.

Next, the sidewall film and the thermal oxidation film formed on the side surfaces of the transistor pillars 5 and the second dummy pillar 6 are removed by a dry etching method or a wet etching method.

Then a gate insulator film 10 of a silicon oxide film is formed with a thickness of 3 nm on the side surfaces of the transistor pillars 5 and the second dummy silicon pillar 6A by a thermal oxidation method. Thereafter, a polysilicon film (polycrystalline silicon film) is deposited as a gate electrode with a thickness of 20 nm on the entire surface of the silicon substrate 1 by a CVD method, and entire-surface etching-back is carried out. Thus, a gate electrode 11a is formed on the side surfaces of the transistor pillars 5. At the same time, a first power supply gate electrode 11ba is formed on the side surface of the first dummy pillar 7, and a second power supply gate electrode 11bb is formed on the side surface of the second dummy pillar 6. The second dummy pillar 6 does not serve as a transistor pillar, but serves as a gate electrode connection pillar for connecting the gate electrode 11a and the first power supply gate electrode 11ba to each other.

As described above, the intervals between the transistor pillars 5, the interval between the transistor pillar 5 and the second dummy pillar 6, and the interval between the second dummy pillar 6 and the first dummy pillar 7 are not more than two times the film thickness of the gate electrode 11. Therefore, as shown in FIG. 14, the spaces between the transistor pillars 5, the space between the first transistor pillar 5A1 and the second dummy pillar 6, and the space between the second dummy pillar 6 and the first dummy pillar 7 are completely filled with the gate electrode 11a and the power supply gate electrodes 11bb and 11ba, so that those electrodes are connected to each other and unified together.

Figure 15:
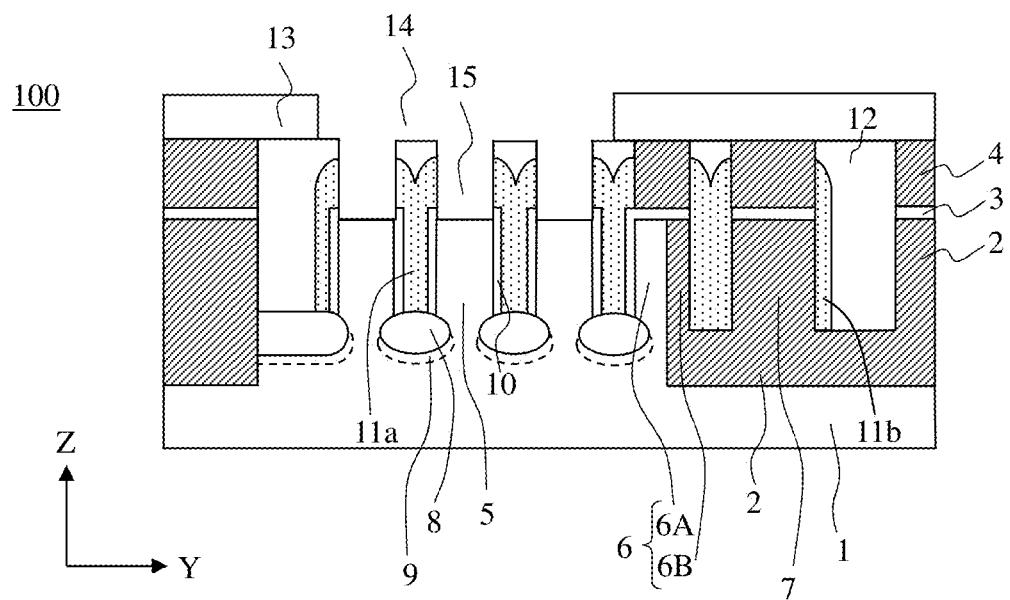
FIG. 15 is a diagram (cross-sectional view) explanatory of a method of manufacturing a semiconductor device according to the first embodiment of the present invention.

Then, as shown in FIG. 15, a first interlayer insulator film 12 of a silicon oxide film is formed by a CVD method so that the electrodes 11 are covered with the first interlayer insulator film 12 and that the transistor pillars 5, the second dummy pillar 6, and the first dummy pillar 7 are embedded in the first interlayer insulator film 12. Thereafter, the first interlayer insulator film 12 is flattened by a CMP method so that the mask film 4 is exposed. Subsequently, a mask film 13 of a silicon oxide film is deposited with a thickness of 50 nm on the exposed mask film 4 and the first interlayer insulator film 12 by a CVD method.

Next, a portion of the mask film 13 is removed by using a photolithography method and an etching method. In the plan view, a portion of the mask film 13 where the transistor pillars 5 are arranged and the vicinity thereof are removed. The mask film 4 located above the transistor pillars 5 is exposed in an opening portion 14, which is formed by the removal of the mask film 13. Then the exposed mask film 4 is selectively removed by a wet etching method. The newly exposed insulator film 3 is also removed. Thus, opening portions 15 are formed above the transistor pillars 5. The upper surfaces of the transistor pillars 5 are exposed at the bottom of the opening portions 15, and portions of the gate electrode 11a are exposed on side surfaces of the opening portion 15.

Figure 16:
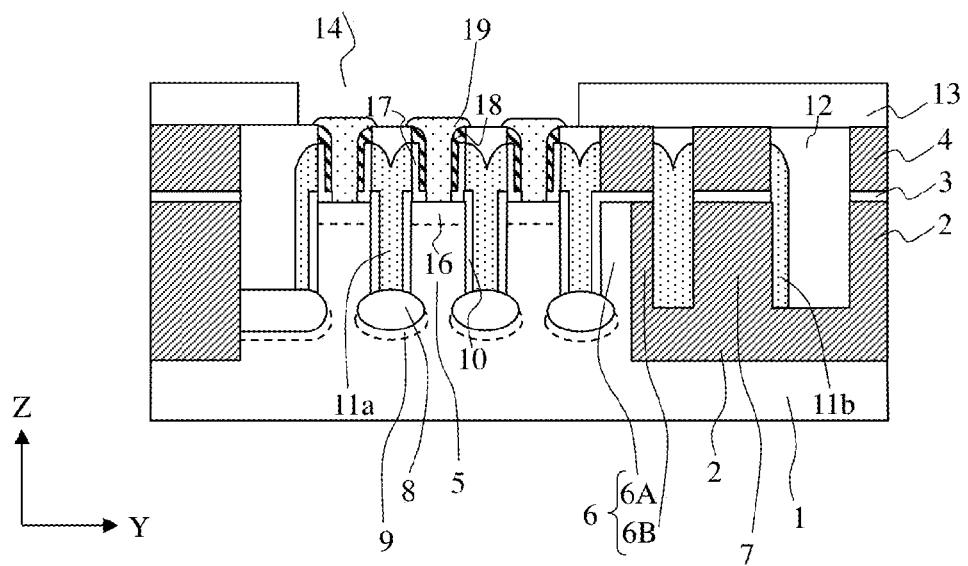
FIG. 16 is a diagram (cross-sectional view) explanatory of a method of manufacturing a semiconductor device according to the first embodiment of the present invention.

Then, as shown in FIG. 16, an insulator film 17 of a thermal oxidation film (silicon oxide film) is formed on the upper surfaces of the transistor pillars 5 (silicon) exposed in the opening portions 15 and the side surfaces of the electrodes 11 (polysilicon) by a thermal oxidation method. Thereafter, ions of an impurity (phosphorus or arsenic in a case of an n-type transistor) is implanted into upper portions of the transistor pillars 5 through the opening portions 15 to form a pillar upper diffusion layer 16. Subsequently, a silicon nitride film is deposited with a thickness of 10 nm by a CVD method, and etching-back is carried out. Thus, a sidewall film 18 is formed on inner walls of the opening portions 15. When the sidewall film 18 is formed, the insulator film 17 formed on the upper surfaces of the transistor pillars 5 is also removed so that the upper surfaces of the transistor pillars 5 are exposed. At that time, a portion of the insulator film 17 remains below the sidewall film 18 and on the exposed surface of the gate electrode 11a in the opening portions 15. The sidewall film 18 serves to ensure insulation between silicon plugs to be formed and the gate electrode 11a. Next, a selective epitaxial growth method is used to grow silicon plugs 19 on the upper surfaces of the transistor pillars 5 so that the opening portions 15 are filled with the silicon plugs 19. Then ions such as arsenic are implanted so as to form the silicon plugs 19 into an n-type conductor. Thus, the silicon plugs 19 electrically contact with the pillar upper diffusion layer 16 formed above the transistor pillars 5.

Figure 17:
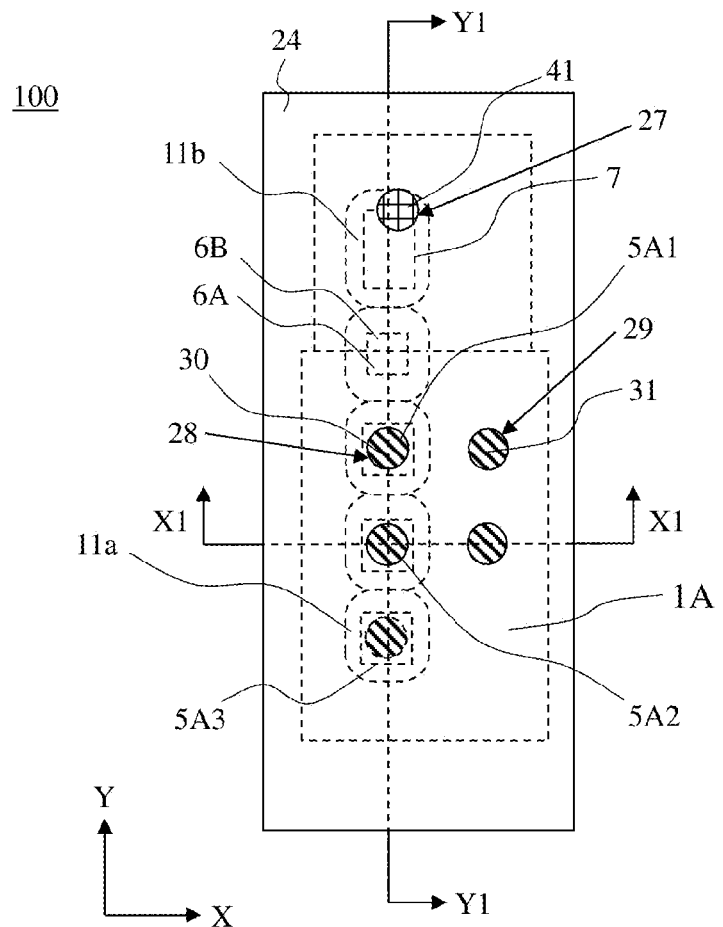
FIG. 17 is a diagram (plan view) explanatory of a method of manufacturing a semiconductor device according to the first embodiment of the present invention.
Figure 18:
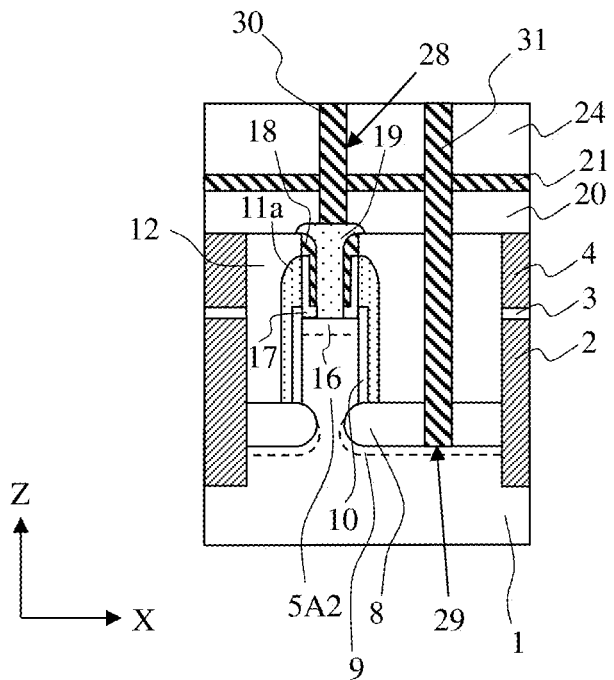
FIG. 18 is a cross-sectional view taken along line X1-X1 of FIG. 17.
Figure 19:
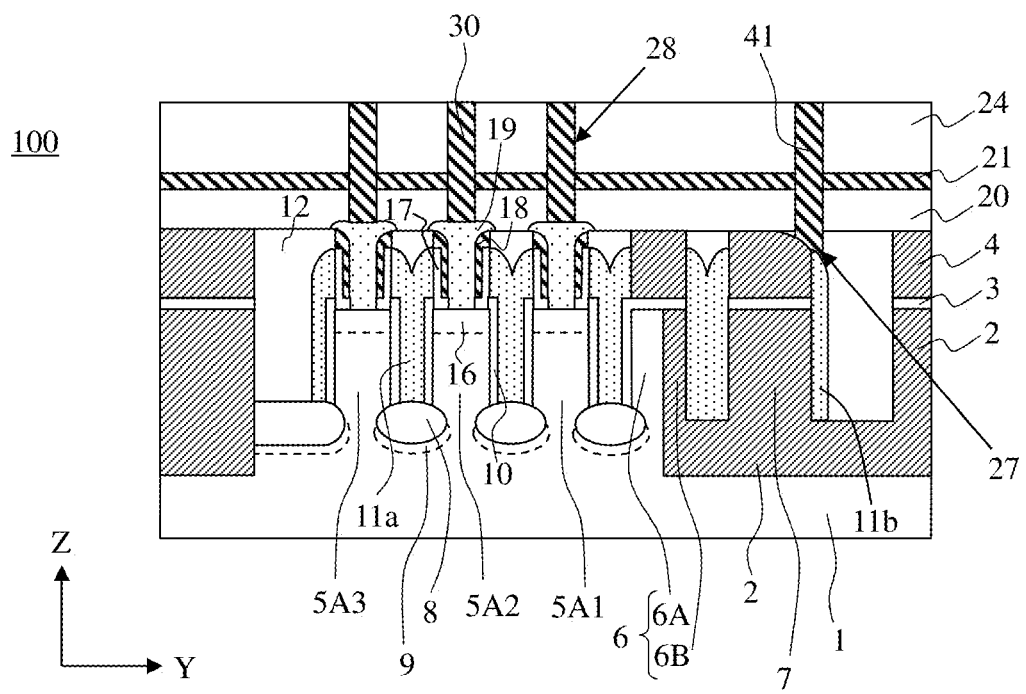
FIG. 19 is a cross-sectional view taken along line Y1-Y1 of FIG. 17.

Reference is now made to FIGS. 17 to 19. FIG. 17 is a plan view explanatory of a process following the process illustrated in FIG. 16. FIG. 18 is a cross-sectional view taken along line X1-X1 of FIG. 17, and FIG. 19 is a cross-sectional view taken along line Y1-Y1 of FIG. 17. In FIG. 17, components underlying the uppermost layer are indicated by broken lines, for clarifying the arrangement of components.

As shown in FIGS. 17 to 19, a silicon oxide film is deposited by a CVD method so that the opening portion 14 is filled with the silicon oxide film. Thus, a second interlayer insulator film 20 including the mask film 13 is formed. Subsequently, an upper surface of the second interlayer insulator film 20 is flattened, and then a stopper film 21 of a silicon nitride film is deposited with a thickness of 20 nm by a CVD method. Then a third interlayer insulator film 24 of a silicon oxide film is deposited with a thickness of 150 nm by a CVD method. Thereafter, contact holes 27 to 29 are formed by using a photolithography method and a dry etching method.

As shown in FIG. 17, the contact hole 27 is formed at a location deviated from the center of the first dummy pillar 7. The contact holes 28 are formed such that the centers of those contact holes 28 are aligned with the centers of the transistor pillars 5. The contact holes 29 are formed in the active region 1A such that the contact holes 29 are spaced from the first transistor pillar 5A1 and the second transistor pillar 5A2 by a certain distance. Those contact holes 27 to 29 may have a circular cross-sectional shape.

The contact hole 27 is formed at a location deviated from the center of the first dummy pillar 7. Therefore, as can be seen from FIG. 19, a portion of the mask film 4 formed above the first dummy pillar 7 and a portion of the power supply gate electrode 11b formed on the side surface of the first dummy pillar 7 are exposed at the bottom of the contact hole 27. As can be seen from FIGS. 18 and 19, at least a portion of the silicon plugs 19 is exposed at the bottoms of the contact holes 28. As can be seen from FIG. 18, a portion of the pillar lower diffusion layer 9 is exposed at the bottom of the contact holes 29.

During the formation of the contact holes 28, dry etching is stopped by the stopper film 21 to control the depth down to the silicon plugs 19. The contact holes 27 to 29 may be formed concurrently or separately.

Next, a metal multilayer film of tungsten (W), titanium nitride (TiN), and titanium (Ti) is deposited by a CVD method so that the third interlayer insulator film 24 is covered with the metal multilayer film. Thus, the interiors of the contact holes 27 to 29 are filled with the metal multilayer film. Then the metal multilayer film is removed from an upper surface of the third interlayer insulator film 24 by a CMP method. Thus, first plugs 30 connected to the silicon plugs 19, second plugs 31 connected to the pillar lower diffusion layer 9, and a contact plug 41 connected to the power supply gate electrode 11b are formed.

Next, as shown in FIGS. 3 to 5, interconnections 33, 34, and 42 of tungsten (W) and tungsten nitride (WN) are formed by a sputtering method. At that time, the contact plug 41 is connected to the interconnection 42. The second plugs 31 connected to the pillar lower diffusion layer 9 are connected to the interconnection 34. The first plugs 30 connected to the pillar upper diffusion layer 16 formed on the transistor pillars 5 are connected to the interconnection 33. Thus, a semiconductor device 100 is completed.

As described above, according to the present embodiment, the second dummy pillar 6 is disposed between the transistor pillars 5 and the first dummy pillar 7. Therefore, influence from the optical proximity effect caused by different sizes of two-dimensional patterns between the transistor pillars 5 and the first dummy pillar 7 can be reduced, so that variations in size of the transistor pillars 5 can be prevented. As a result, a semiconductor device (parallel transistor) can be obtained with stable characteristics.

Second Embodiment

Now a semiconductor device 200 according to a second embodiment will be described with reference to FIG. 20. In the second embodiment, a third dummy pillar is additionally disposed adjacent to the second dummy pillar of the first embodiment. In the second embodiment, components having the same functions as those in the first embodiment are denoted by the same reference numerals, and the detailed explanation thereof will be omitted. Thus, the following description is primarily focused on differences between the second embodiment and the first embodiment.

Figure 20:
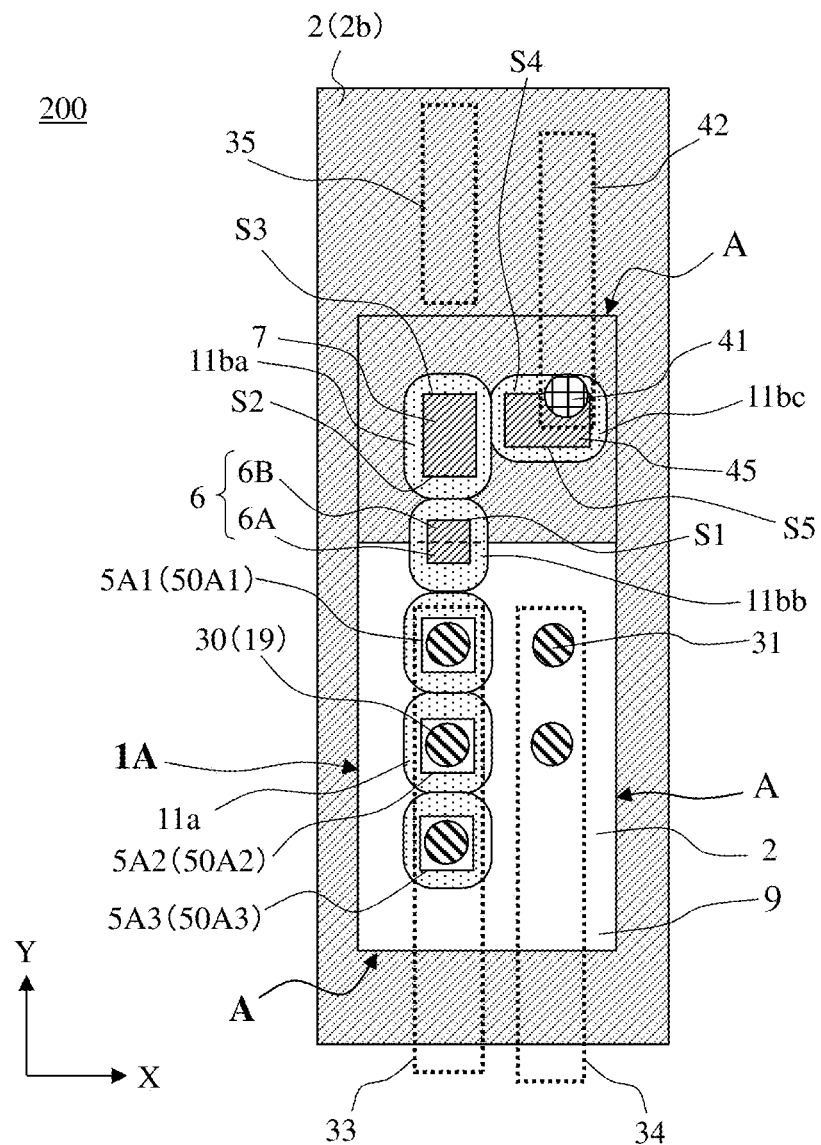
FIG. 20 is a schematic diagram (plan view) showing a configuration of a semiconductor device according to a second embodiment of the present invention.

Referring to FIG. 20, a second dummy pillar 6 is located at an interface between the active region 1A and the device isolation region 2 in the pillar groove formation region A. Furthermore, a first dummy pillar 7 and a third dummy pillar 45 are arranged at the device isolation region 2 in the pillar groove formation region A. The third dummy pillar 45 is disposed adjacent to the first dummy pillar 7 in the X-direction with a certain interval between the third dummy pillar 45 and the first dummy pillar 7. The third dummy pillar 45 has a rectangular shape in the plan view. More specifically, a first end S1 of the second dummy pillar 6 in the Y-direction faces a first end S2 of the first dummy pillar 7 in the Y-direction. Furthermore, a second end S3 of the first dummy pillar 7 in the Y-direction and a first end S4 of the third dummy pillar 45 in the Y-direction are on the same straight line along the X-direction. The second end S3 of the first dummy pillar 7 in the Y-direction and a second end S5 of the third dummy pillar 45 in the Y-direction may be on the same straight line along the X-direction. The third dummy pillar 45 has such a rectangular shape that the width of the third dummy pillar 45 in one of the X-direction and the Y-direction is greater than the width of the transistor pillars 5 but is not greater than 1.5 times the width of the transistor pillars 5. In this example, the width of the third dummy pillar 45 in the X-direction is 75 nm, the width of the third dummy pillar 45 in the Y-direction is 50 nm, and the interval between the third dummy pillar 45 and the first dummy pillar 7 is 30 nm.

A contact plug 41, which has a circular shape in the plan view, is arranged on the third dummy pillar 45 so that the center of the contact plug 41 is deviated from the center of the third dummy pillar 45. The contact plug 41 is disposed at such a position that it partially overlaps the third dummy pillar 45 in the plan view. The contact plug 41 slightly extends outward from the third dummy pillar 45 in the Y-direction. In FIG. 20, the contact plug 41 is offset in the X-direction and the Y-direction with respect to the third dummy pillar 45. However, the arrangement of the contact plug 41 is not limited to this example. For example, the contact plug 41 may be offset either in the X-direction or in the Y-direction as long as it is out of contact with the active region 1A and all of the transistor pillars 5. An interconnection 42 is disposed on an upper surface of the contact plug 41. The interconnection 42 extends along the Y-direction. Furthermore, an interconnection 35 is disposed adjacent to the interconnection 42. More specifically, the interconnection 35 is formed on the same line as the line with which the centers of the first dummy pillar 7 and the second dummy pillar 6 are aligned.

Power supply gate electrodes 11b (11ba, 11bb, and 11bc) are provided on side surfaces of the first dummy pillar 7, the second dummy pillar 6, and the third dummy pillar 45. The portion of the contact plug 41 that extends outward from the third dummy pillar 45 is connected to the power supply gate electrode 11bc provided on the side surface of the third dummy pillar 45. The gate electrodes 11ba and 11bc, each of which has a thickness of 20 nm, are formed on the side surfaces of the first dummy pillar 7 and the third dummy pillar 45 and connected to each other between the first dummy pillar 7 and the third dummy pillar 45. Thus, the gate electrodes 11ba and 11bc serve as one gate electrode. With this configuration, a gate voltage supplied from the power supply gate electrode 11bc of the third dummy pillar 45 is supplied to the gate electrode 11a of the first transistor pillar 5A1 via the power supply gate electrodes 11ba and 11bb of the first dummy pillar 7 and the second dummy pillar 6.

With the above arrangement, as with the semiconductor device 100 of the first embodiment, the semiconductor device 200 according to the second embodiment can avoid problems of variations in transistor characteristics. Furthermore, in the semiconductor device 200, the first dummy pillar 7 and the second dummy pillar 6 are arranged on a virtual straight line (hereinafter referred to as a first line). The third dummy pillar 45 is arranged on another virtual line (a second line) that is perpendicular to the first line and passes through the first dummy pillar 7. Therefore, the contact plug 41 can be arranged at a position deviated from the first line, so that the flexibility for design of wirings can be increased. For example, the interconnection 35 can be arranged on the first line in parallel to the interconnection 42 extending along Y-direction.

The method of manufacturing the semiconductor device 200 is the same as the method of manufacturing the semiconductor device 100 except that an exposure mask including a mask pattern (light shield portion) corresponding to the third dummy pillar 45 is used instead of the exposure mask 150. Therefore, the detailed explanation of the method of manufacturing the semiconductor device 200 is omitted herein.

Although preferred embodiments of the present invention have been described above, the present invention is not limited to the aforementioned embodiments. As a matter of course, various modifications can be made therein without departing from the spirit of the present invention, and those modifications should be included in this present invention.

For example, the above embodiments have focused on variations in two-dimensional shape of a transistor pillar located at one end of the array of the transistor pillars, which are arranged along the Y-direction. Depending upon the lithography conditions, however, a transistor pillar located at the other end of the array of the transistor pillars may also suffer from variations (distortions) of the two-dimensional shape that are caused when there is no adjacent transistor pillar. In such a case, the transistor pillar located at the other end of the array of the transistor pillars may be used as a dummy pillar. Alternatively, a new dummy pillar may be arranged adjacent to the transistor pillar located at the other end of the array of the transistor pillars with a certain interval between the dummy pillar and the transistor pillar in the Y-direction. The new dummy pillar may be a silicon pillar, or a composite pillar of a silicon pillar and an insulator film pillar, or an insulating pillar. With such a dummy pillar, distortions of the two-dimensional shape of a transistor pillar disposed adjacent to the dummy pillar can be suppressed.

What is claimed is:

1. A semiconductor device comprising:
   an active region defined by a device isolation region arranged on a surface of a semiconductor substrate;
   a plurality of transistor pillars arranged along a first direction within the active region;
   a first dummy pillar disposed in the device isolation region, the first dummy pillar being arranged on a line extending along the first direction from the plurality of transistor pillars;
   a second dummy pillar disposed between the plurality of transistor pillars and the first dummy pillar;
   a gate electrode continuously extending so as to surround each of side surfaces of the plurality of transistor pillars;
   a first power supply gate electrode surrounding a side surface of the first dummy pillar; and
   a second power supply gate electrode surrounding a side surface of the second dummy pillar, the second power supply gate electrode being connected to the gate electrode and the first power supply gate electrode.

2. The semiconductor device according to claim 1, wherein the first dummy pillar has a two-dimensional pattern greater than a two-dimensional pattern of each of the plurality of transistor pillars, and
   the second dummy pillar has a two-dimensional pattern smaller than the two-dimensional pattern of each of the plurality of transistor pillars.

3. The semiconductor device according to claim 2, wherein the two-dimensional pattern of the first dummy pillar has an area that is equal to or less than 1.5 times an area of the two-dimensional pattern of each of the plurality of transistor pillars.

4. The semiconductor device according to claim 3, wherein the width of the two-dimensional pattern of the first dummy pillar in the first direction is greater than the two-dimensional pattern of each of the plurality of transistor pillars and is equal to or less than 1.5 times the two-dimensional pattern of each of the plurality of transistor pillars, and
   the width of the two-dimensional pattern of the first dummy pillar in a second direction perpendicular to the first direction is equal to the two-dimensional pattern of each of the plurality of transistor pillars.

5. The semiconductor device according to claim 1, wherein the plurality of transistor pillars have substantially the same two-dimensional pattern.

6. The semiconductor device according to claim 1, wherein each of the plurality of transistor pillars is subjected to full depletion.

7. The semiconductor device according to claim 1, further comprising a contact plug connected to the first dummy pillar,
   wherein electric power is supplied to the gate electrode via the contact plug, the first power supply gate electrode, and the second power supply gate electrode.

8. The semiconductor device according to claim 1, wherein the gate electrode, the first power supply gate electrode, and the second power supply gate electrode are formed of the same conductive layer produced in the same process.

9. The semiconductor device according to claim 1, further comprising:
   a third dummy pillar arranged adjacent to the first dummy pillar in the device isolation region;
   a third power supply gate electrode surrounding a side surface of the third dummy pillar, the third power supply gate electrode being connected to the first power supply gate electrode; and
   a contact plug connected to the third dummy pillar,
   wherein electric power is supplied to the gate electrode via the contact plug, the third power supply gate electrode, the first power supply gate electrode, and the second power supply gate electrode.

10. The semiconductor device according to claim 9, wherein the gate electrode, the first power supply gate electrode, the second power supply gate electrode, and the third power supply gate electrode are formed of the same conductive layer produced in the same process.

11. A semiconductor device comprising:
a plurality of transistor pillars arranged in a row at equal intervals within an active region defined by a device isolation region;
a first dummy pillar disposed in the device isolation region so that the first dummy pillar is aligned with the row of the plurality of transistor pillars; and
a second dummy pillar disposed centrally between one of the plurality of transistor pillars and the first dummy pillar,
wherein the first dummy pillar has a two-dimensional pattern greater than a two-dimensional pattern of each of the plurality of transistor pillars, and the second dummy pillar has a two-dimensional pattern smaller than the two-dimensional pattern of each of the plurality of transistor pillars.

12. The semiconductor device according to claim 11, further comprising a gate electrode continuously extending so as to surround side surfaces of the plurality of transistor pillars, a side surface of the first dummy pillar, and a side surface of the second dummy pillar.

13. The semiconductor device according to claim 12, further comprising a gate insulator film formed between the side surfaces of the plurality of transistor pillars and the gate electrode.

14. The semiconductor device according to claim 12, further comprising a contact plug connected to an upper surface of the first dummy pillar and to the gate electrode.

* * * * *